United States Patent [19]

Beardsley et al.

[11] Patent Number: 5,148,540
[45] Date of Patent: Sep. 15, 1992

[54] SYSTEM WITH BACKUP OF DATA STORAGE STATUS AND DEVICE IDENTIFICATION FOR ENABLING SYSTEM RECOVERY AFTER POWERLOSS

[75] Inventors: Brent C. Beardsley, Tucson, Ariz.; Lawrence H. Boulia, Gaithersburg, Md.; Robert H. Vosacek, Tucson, Ariz.

[73] Assignee: International Business Machines Corporation, Armonk, N.Y.

[21] Appl. No.: 489,888

[22] Filed: Mar. 7, 1990

Related U.S. Application Data

[63] Continuation of Ser. No. 87,331, Aug. 20, 1987, abandoned.

[51] Int. Cl.[5] .............................................. G06F 1/30
[52] U.S. Cl. ................................... 395/575; 364/285; 364/285.3; 364/273.4; 364/280.2; 364/DIG. 1
[58] Field of Search ... 364/200 MS File, 900 MS File

[56] References Cited

U.S. PATENT DOCUMENTS

| | | | |
|---|---|---|---|
| 4,025,906 | 5/1977 | Riikonen | 364/200 |
| 4,038,537 | 7/1977 | Cassarino, Jr. et al. | 371/51 |
| 4,162,520 | 7/1979 | Cook | 364/200 |
| 4,207,609 | 6/1980 | Luiz et al. | 364/200 |
| 4,237,533 | 12/1980 | Mills | 364/200 |
| 4,262,332 | 4/1981 | Bass et al. | 364/200 |
| 4,371,952 | 2/1983 | Schuck | 304/900 |
| 4,456,966 | 6/1984 | Bringol et al. | 364/900 |
| 4,467,421 | 8/1984 | White | 364/200 |
| 4,507,730 | 3/1985 | Johnson et al. | 364/200 |
| 4,507,751 | 3/1985 | Gawlick | 364/900 |
| 4,545,010 | 10/1985 | Salas et al. | 364/200 |
| 4,563,736 | 1/1986 | Boudreau et al. | 364/200 |
| 4,648,036 | 3/1987 | Gallant | 364/200 |
| 4,750,106 | 6/1988 | Aiken | 364/200 |
| 4,823,261 | 4/1989 | Bank | 364/200 |
| 4,839,895 | 6/1989 | Makita | 371/16.1 |

FOREIGN PATENT DOCUMENTS

| | | |
|---|---|---|
| 0059838 | 2/1982 | European Pat. Off. |
| 0062463 | 3/1982 | European Pat. Off. |
| 0081056 | 10/1982 | European Pat. Off. |
| 0205965 | 5/1986 | European Pat. Off. |

OTHER PUBLICATIONS

R. A. Angstadt, et al *IBM Technical Disclosure Bulletin*, vol. 18, No. 11, Apr. 1976, "Error Recovery from Controller Failures etc." pp. 3577, 3578.

W. D. Frender, et al *IBM Technical Disclosure Bulletin*, vol. 18, No. 11, Apr. 1976, "Mass Storage System Control-Table Analysis", pp. 3581-3583.

F. E. Lester et al *IBM Technical Disclosure Bulletin*, vol. 18, No. 11, Apr. 1976, "Auditing Mass Storage Systems", pp. 3584-3586.

R. L. Blickenstaff, et al. *IBM Technical Disclosure Bulletin*, vol. 20, No. 3, Aug. 1977, "Multilevel Store Directory Integrity", pp. 939, 940.

*Primary Examiner*—Thomas C. Lee
*Assistant Examiner*—Eric Coleman
*Attorney, Agent, or Firm*—Whitham & Marhoefer

[57] ABSTRACT

A technique is described for assuring the global identification and management of interchangeable data storage devices in a data processing system, assuring the integrity of data storage devices after shutdowns or failures and providing these capabilities without changing any current system or application software on the host. This technique also provides high availability of data storage devices by swapping a failing data storage device with a good data storage device without host intervention.

10 Claims, 2 Drawing Sheets

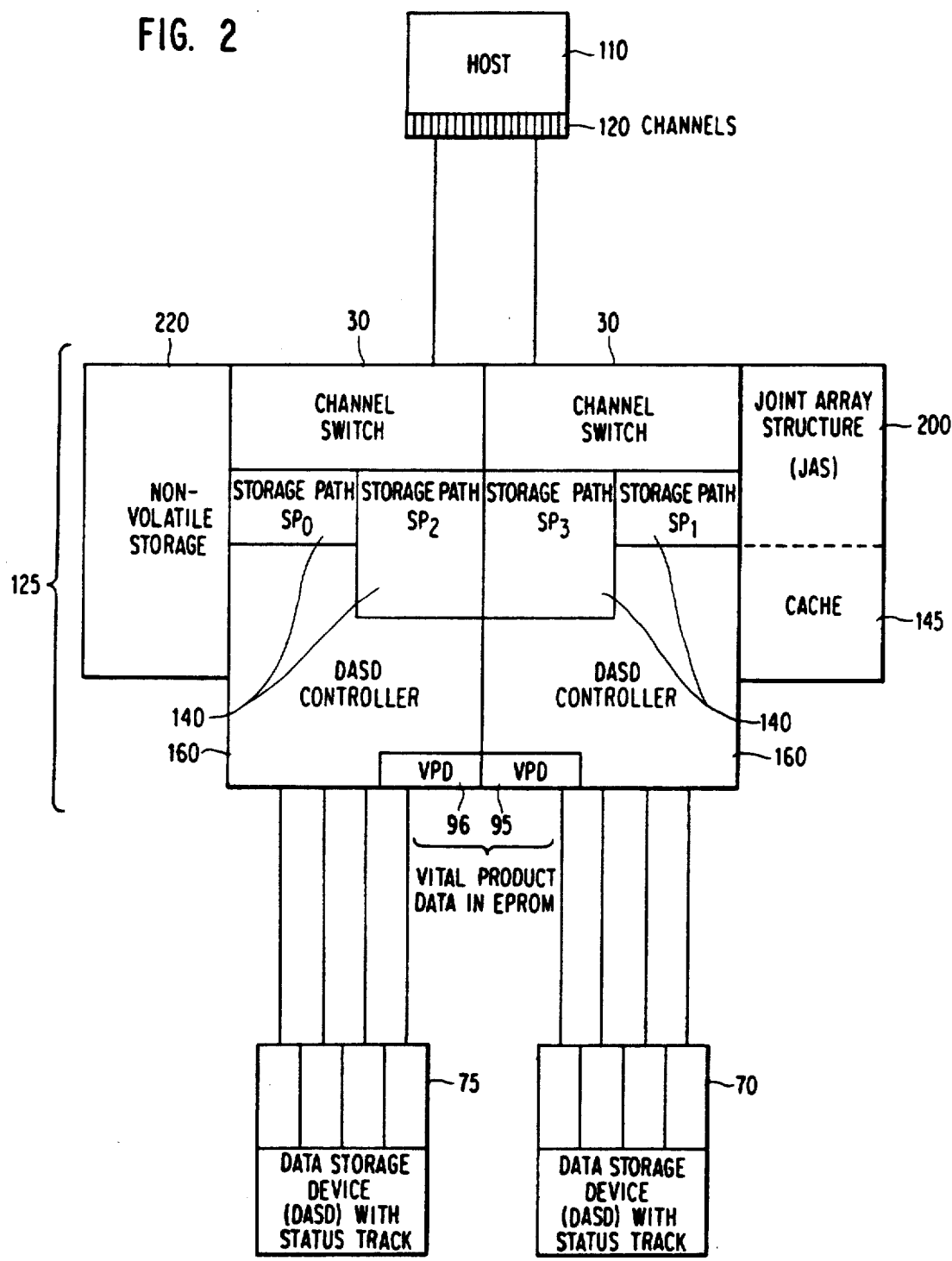

SYSTEM WITH BACKUP OF DATA STORAGE STATUS AND DEVICE IDENTIFICATION FOR ENABLING SYSTEM RECOVERY AFTER POWERLOSS

This is a continuation of Ser. No. 07/037,331 Aug. 20, 1987 now abandoned.

BACKGROUND OF THE INVENTION

1. Field of the Invention

This invention generally relates to improvements in data storage devices for the input and output of information to a data processing system and, more particularly, to the retention of status and device identification information on a status track of each of the data storage devices and another location to provide global identification and management of interchangeable data storage devices.

2. Description of the Prior Art

The past several years have seen the growth of online workstations, the evolution of distributed processing, and the acceleration of information technology in many new application areas. The result has been an increase in the use of online data base systems and a growth in the requirement for storage capacity and increased reliability and flexibility in data storage devices.

The concepts of self-test, redundancy, cross-check verification between various sources of information and the like are well known in the art. Particularly, with the advent of complex digital computer systems used for applications such as process control or supervisory control. An example of such a system is illustrated in U.S. Pat. No. 4,032,757 to Eccles, which uses a pair of channels to continually compare the events occurring in each computer. The constant comparison allows the additional processor to quickly take over control of the process if the other processor fails. The problem with this approach is the time that the extra processor needs to begin processing after a failure. In critical processes such as in a nuclear power plant, any time lag could be unacceptable. A better approach is presented in U.S. Pat. No. 4,270,168 to Murphy et al., which uses a plurality of processors, self checks and joint answer checking to assure that each processor can assume real time utilization for another processor in the event of a failure. The increased reliability presented in these systems is a memory resident application approach that fails to handle a large data base application spanning many data storage devices.

The general configuration of a data processing system typically comprises a host processor or processors, a memory and various peripheral units. The peripheral units include terminals, printers, communications devices and data storage devices (DASD). We are concerned with the control that provides information from DASD to a data base application residing in the host processor memory. A good example of prior art approaches to this type of processing is presented in U.S. Pat. No. 3,999,163 to Levy et al., U.S. Pat. No. 4,067,059 to Derchak and U.S. Pat. No. 4,189,769 to Cook et al. These patents present various ways to enable a host to process information residing on DASD. While these patents describe production systems that readily lend themselves to data base applications, they are lacking the capability of retaining status information when a power-off occurs in an environment designed to provide high availability of DASD information.

SUMMARY OF THE INVENTION

It is therefore an object of this invention to provide a technique which allows the global identification and management of interchangeable data storage devices in a data processing system.

It is a further object of the invention to provide a technique to protect data storage device status across shutdowns or failures.

It is another object of the invention to provide the foregoing capabilities without impacting current software applications on the host.

It is yet another object of the invention to provide high availability of the data storage devices.

According to the invention, these objects are accomplished by providing a method of employing the data storage devices to make the joint array structure information nonvolatile for routing host requests for information to and from the correct data storage device and keeping status information concerning the data storage devices.

BRIEF DESCRIPTION OF THE DRAWINGS

The foregoing and other objects, aspects and advantages of the invention will be better understood from the following detailed description of the preferred embodiment of the invention with reference to the accompanying drawings, in which:

FIG. 2 is a block diagram showing the basic elements of the new data storage system.

DESCRIPTION OF THE PREFERRED EMBODIMENT

Figure 1:
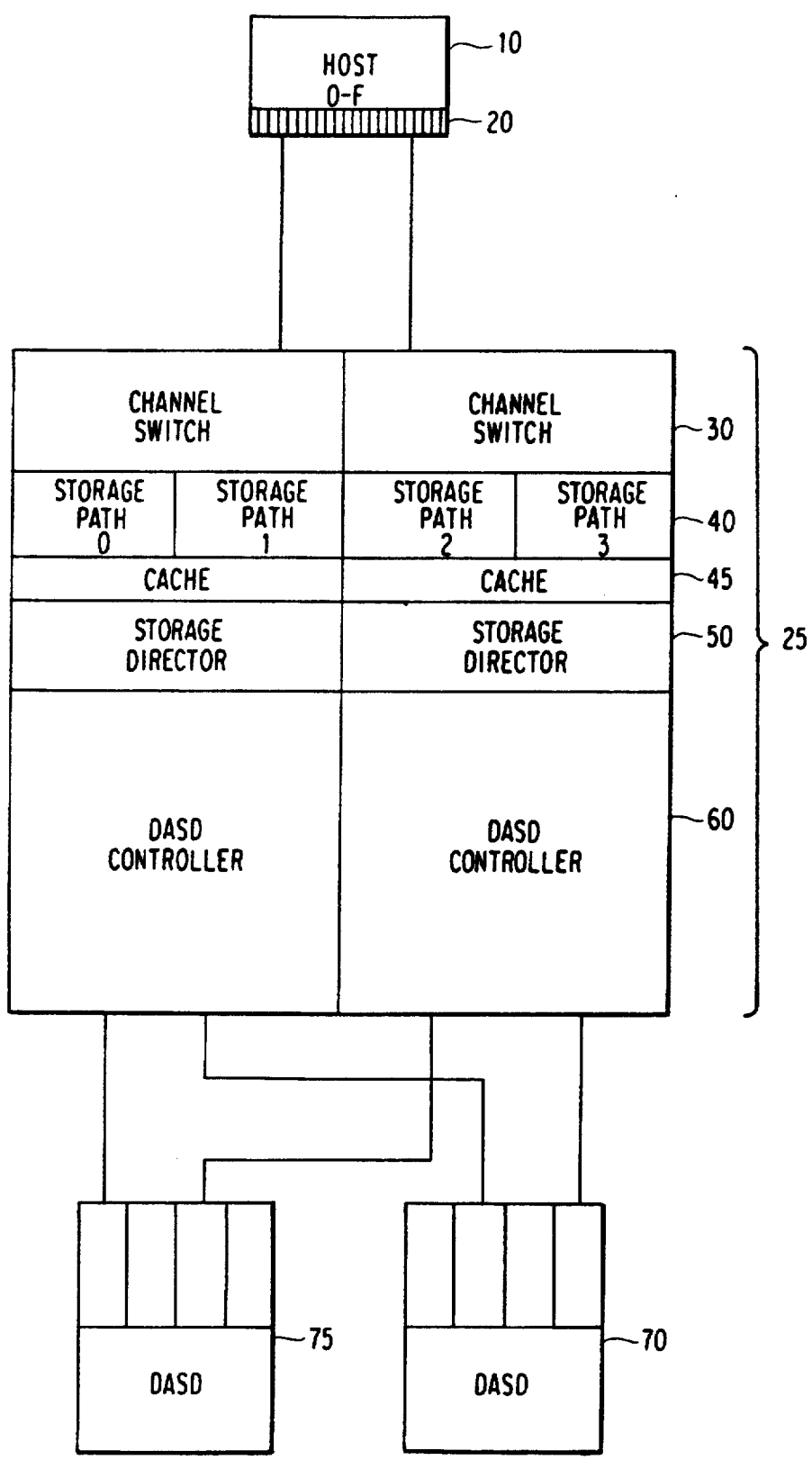
FIG. 1 is a block diagram showing a typical prior art data storage system of U.S. Pat. No. 4,207,609.

The following disclosure describes a method for improved management of data storage devices and the data stored on them. Status and identification information are retained on the data storage devices and a backup medium to assure the retention of information when a power out or other disablement of the devices occur and to verify that the correct physical devices are still attached to the controllers when the data storage device resumes operation.

Referring now to the drawings, and more particularly to FIG. 1, there is depicted a typical prior art data storage system. FIG. 1 shows a multi-CPU and shared DASD configuration according to U.S. Pat. No. 4,207,609 assigned to the assignee of this invention. Three CPUs 1, 3, and 4 hereinafter designated by Roman numerals respectively CPU I CPU II and CPU III, are suitably cross-connected to a pair of control units 21 and 23, hereinafter designated CU I and CU II over counterpart channels. In this regard, CPU I attaches four channels 5, 7, 8 and 10, CPU II attaches two channels 9 and 12, and CPU III attaches two channels 14 and 16. Channels 1 and 2 of CPU I terminate in CU I ports a and b, while channels 3 and 4 of CPU I terminate in CU II ports e and f. Channel 1 of CPU II terminates in CU I port c, and channel 2 of CPU II terminates in CU II port g. Lastly channel 1 of CPU III terminates in port d of CU I and channel 2 of CPU III terminates in port H of CU II. CU I and CU II attach devices 53 through DASD controllers 27 and 29 over a demand/response interface embracing tag and data lines. The interface between CU I and DASD controller 27 includes tag lines 65 and data/in and data/out lines 57 and 59. Likewise, tag lines 67 and data/in and data/out paths 61 and 63 couple CU II to DASD controller 29.

The demand/response type interface is one in which the tag out identifies and validates the information on the data line out. In this regard, each CPU/control unit/device operates asynchronously with respect to one another in which directional control is asserted from the top down. Active connection between elements for executing operations is necessary for extended periods only in respect of the movement of data from device to channel or from channel to device. Otherwise, tasks or operations may be performed in disconnect mode. Devices 53 are accessed either through DASD controller 27 or DASD controller 29. DASD controller 27 includes attachment logic 39 and sequence controller 41 coupling devices 53 over path 55. Similarly, DASD controller 29 includes attachment logic 47 and sequence controller 49 to operate devices 53 over path 1. Memory 25' contains the map of network topology and the necessary context information utilized by the CUs in managing the connection between CPUs to devices. Memory 25' comprises a pair of random access memories (RAM) 43 and 45 which can be commonly accessed by either CU through the appropriate attachment logic. CU I can access for reading, writing or updating purposes RAM 43 and 45 through attachment logic 39, and path 67. CU II can commonly access the RAMs over attachment logic 47 and path 65. The operations concerned with accessing of devices 53 involving the dispatching and positioning of electromechanical elements such as the head disk arm assembly on direct access storage devices 0–4 is regulated by the commands and parameters sent from the control unit through the attachment logic and sequence controller.

An example of the host CPU is the IBM 3090 processor. The IBM 3090 is a compatible growth system which uses either Multiple Virtual Storage/Extended Architecture (MVS/XA) or Virtual Machine (VM) as an operating system. The operating system controls the flow of data to/from main storage and provides an application environment which is System/370 compatible. The IBM 3090 processor is described in more detail in IBM publication, 3090 *Processor Complex Installation Manual — Physical Planning*, GC22-7074. An example of DASD controllers 27 and 29 is the IBM 3880 Model 23 DASD Controller. The IBM 3880 Model 23 contains a high speed cache and two storage directors 41 and 49, each with a single storage path for independent control of attached DASD devices 53. The IBM 3880 controller is described in IBM publication, IBM 3880 Storage Control Model 23 Description, GC32-0082. A good example of a DASD device 0–3 is the IBM 3380, which provides a fixed-medium head and disk assembly (HDA) that contains the heads, disks and access mechanisms (actuators) within a sealed enclosure. Each 3380 unit contains two HDAs. There are two independent, movable actuators within each HDA. Each actuator has its own address which is selectable from the CPUs. A string of DASDs attached to a 3880 storage director can contain four units (sixteen actuators . A more detailed description of the IBM 3380 DASD is found in IBM publication, 3380 Description and User's Guide, GA26-1664.

To understand the subject invention, it will be necessary to discuss some of the details of the prior art DASD system operation. When the Host CPU requires information, it requests it by requesting a specific channel, controller and DASD actuator. The channel number is a one byte hexadecimal number, the controller is a four bit hexadecimal number and the DASD actuator number is a four bit hexadecimal number. For example, if the host CPU sent a two byte hexadecimal address 0111 in a start input/output operation (I/O), then actuator one, attached to controller one, attached to channel one would prepare for I/0 and send the host a ready signal. Since the mapping down and back is the same, the original transaction header can be used to determine the path back to the host. Any host program accessing the DASD could send the header described above to uniquely define the DASD actuator to access.

Referring now to FIG. 2, a diagram showing the basic elements of the new data storage system is shown. The basic structure is very similar to FIG. 1. A host CPU 110 is attached via its channels 120 to a DASD controller 125 which is attached to DASDs 70 and 75. Information is passed through the described path to the host. A major difference between the prior art and the invention is the subsystem status, which contains information used to manage the data storage system, and the nonvolatile storage 220. The DASD controller 160 also contains an EPROM vital product data area 95. The vital product data area contains pointers to the global status track.

The joint array structure (JAS) 200 is used to conserve the host to DASD interface and implement the dual copy, high availability functions. The dual copy function provides enhanced data availability and reliability by maintaining two identical copies of volumes, called a duplex pair, on two physically separated DASD units, for example, the primary data storage device 70 and the secondary data storage device 75. The dual copy has a first copy of the data which is referred to a primary copy and a second copy which is referred to as a secondary copy. To understand the method of the present invention better, a preferred embodiment is described employing the environment presented in FIG. 2. A first data storage device 70 and a second data storage device 75 each have a dedicated status track for the retention of status information. The dedicated status track is unusable by non-system applications and retains two copies of the global subsystem status for the controller and the first and second data storage devices. The storage subsystem is the set consisting of the controller and the attached data storage devices. In the example, this consists of the single controller 125 and the two data storage devices 70 and 75.

Status information about the subsystem is retained across power downs by writing a single record of status and identification information twice on the status track of each device. Global subsystem status is also kept on the first and second data storage devices 70 and 75. Device identification is kept on all the devices in the subsystem, but global subsystem status is only kept on the two global data storage devices. The global subsystem status portion of the record is formatted but not used if the device is not one of the two global subsystem status devices.

The global status pointer contains address information about the two data storage devices and a count of how many times the devices have been reassigned, which is used at initial program load to determine which is the most current copy of the global status pair. A more detailed description of the global status pointer is provided below.

The global subsystem status consists of the following information:

The global status pointer which is a four byte field including the one-byte address of each of the data storage devices including the first 70 and second 75 global data storage devices and a two-byte number which indicates the number of times the definition of the data storage devices have changed. Global status contains the status of the subsystem components, a cache store 145 and a nonvolatile storage 220, and devices as established by failure or system commands.

Information on the status track is divided into device identification and status information. Device identification information is used to insure that the device attached is the one that the subsystem expects. The status information is divided into two types, subsystem status and device status. Subsystem status contains information that pertains to the entire subsystem rather than to a specific device such as the global status pointer, whether the subsystem storage is available or not and information to help insure the integrity of the nonvolatile store. The device status contains information that pertains to a specific DASD device such as the channel address that the device will respond to, whether the device is active for cache or fast write or not, and the duplex pair status of the device. Other information is included with the status track. The above are examples of the information identified. The global subsystem status information discussed above is kept on two devices for availability reasons. However, each device has its device number written. If one device should fail, then the other will be used to keep the information and the failed device will be replaced by another operational device.

Each controller has vital product data that is maintained and used to identify and establish information concerning the hardware characteristics of the attached devices. The vital product data is stored in EPROM in each controller as depicted at 95 and 96 of FIG. 2. The information includes:
Model Type
Configuration
System Adapter and System Address
Subsystem Storage Identification
Storage Control Serial Numbers
Subsystem Storage Size
Nonvolatile Storage Size
Global Status Pointer
Controller Type For Each String
Maximum Number of Drives Configured for Each String.

This information is used to initialize the JAS 200 in the controller 125 to reflect the current system's configuration. In our example, the JAS 200 contains the addresses that data storage device 70 and data storage device 75 are known to the host 110.

When the subsystem is initialized, the following steps are performed:

The devices undergo an initial microprogram load (IML) to establish an operational data path between the attaching channels and the attached devices. The Storage Path (SP) microcode is loaded from the IML device by the support facility in the data storage device. A SP 140 is an addressable, independent processor that routes data to a data storage device 70 or 75. A basic assurance test routine is run to insure that the storage path is operational. This process is coordinated for all of the SPs 140 in the subsystem residing on the controller 125. Each SP 140 can complete IML independent of the other SPs. The location of a global status device is required before access is permitted. If an IML device pointer is available, the most recent pointer must agree with the available device or devices. If one IML device pointer is available, it must point to one device with identical pointers. The IML device pointer does not have to be identical to the device pointer.

Then, the global subsystem status array is read from each of the two global subsystem data storage devices 75 and 70. When valid and current global subsystem status is identified, the global subsystem status is written to both data storage devices to insure the information is consistent on both of the devices. As devices become available, the device number and subsystem identification number of each data storage device is read and checked against the global status array to ensure that the correct hardware is attached and no movement has occurred. When this process is completed, the host is notified of the available SPs 140 and normal processing commences. Device identification is verified to assure that data left in the nonvolatile store for a device is not applied to the wrong device because of a device reconfiguration as a result of device replacement, for instance. The controller can establish a pair of status data storage devices as long as a pair of operational devices can be found to hold the status, or one of the two previous status devices is one of the previous pair and one initialized device can be updated, or both initialized devices can be updated to show the new pair. If the controller cannot establish the two status data storage devices, then it will continue to retry and return an error code for any attempts to access the failing device.

If the current device availability allows a better global subsystem status device configuration, the devices will be reconfigured following these rules:
1) put the devices on separate strings;
2) put the devices on separate units; and
3) put the devices on separate spindles.

The global subsystem status devices are also reassigned by the controller when the controller can only access one of a pair of devices. If it is necessary for any of the reasons described above to reconfigure the system, the order of update will be as follows:
1) Increment the reconfiguration count in the global status pointer to show a reconfiguration has taken place.
2) Global subsystem status will be written to the new global status device. Its status will reflect the new pair.
3) The global subsystem status will be written to the old but still working global status device (in the case of the malfunctioning unit).
4) The global status pointer will be updated in both EPROM vital product areas 95 and 96.

The reconfigured system will be optimally tuned and ready for use when the operations described above are completed.

In operation, if either device fails, the controller will replace the failing device and copy the global status to another storage device. The assignment of a new data storage device is based on the following preference: if two strings of data storage devices are available, as in our case with 70 and 75, then the first available data storage device on each string will be used; however, if only one string is available, then the operational devices in separate physical units will be used.

If new devices are added, or devices are replaced, the devices will be adapted and the status track written as long as the device status on the global subsystem status shows that the device position was not assigned to a fast write or dual copy volume. At installation or initialization, the global status pointers will be 'zeros'. The subsystem will format and write device IDs in all device status tracks, assign global status devices and write global status and write global status pointers to the EPROM.

While the invention has been described in terms of a preferred embodiment in a specific operating system environment, those skilled in the art will recognize that the invention can be practiced, with modification, in other and different operating systems within the spirit and scope of the appended claims.

What is claimed is:

1. A method of retaining information about a data storage subsystem of a data processing system across power downs, said data storage subsystem including a plurality of data storage devices, a controller attached to a host system in said data processing system, said controller including a pair of data storage device controllers and a memory containing vital product data and a joint array structure initialized by said vital product data on initial microprogram load, said vital product data being stored in nonvolatile memory, said data storage device controllers being connected to respective strings of data storage devices, each of said data storage devices being of the same type and having a plurality of data tracks and a status track, said method being performed by said controller transparently to said host system and comprising the steps of:

writing on said status track of each said data storage device identification and status information for the device;

selecting two of said data storage devices and additionally writing global subsystem status on said status track, said global subsystem status containing information pertaining to all components of the subsystem, including a device number and a subsystem identification number of each data storage devices, said global status pointer being stored in said nonvolatile memory, said joint array structure when initialized containing said address information by which the selected data storage devices are known to the host;

when the subsystem is initialized, performing an initial microprogram load to establish an operational data path between attaching channels of said data storage device controllers and said data storage devices;

reading the global subsystem status information from each of the two selected data storage devices and, when valid and current global subsystem status is identified, writing said valid and current global subsystem status to the status track of both said data storage devices to insure the information is consistent on both of the devices;

as data storage devices become available, reading the device number and subsystem identification number of each data storage device and checking said numbers against the global devices information to ensure that said data storage devices are correctly attached; and notifying the host of available storage paths to said plurality of data storage devices.

2. The method as recited in claim 1 wherein the step of selecting is performed by selecting a first of said two data storage devices in a string attached to a first one of said pair of data storage device controllers and a second of said data storage devices in a string attached to a second one of said pair of data storage device controllers.

3. The method recited in claim 2 further comprising, in response to a failure of one of said first or second data storage devices, the steps of:

incrementing a reconfiguration count in said global status pointer to show that reconfiguration has taken place;

selecting a new data storage device to replace the failed device and writing the global subsystem status to the status track of the new device;

writing the global subsystem status to the second or first data storage device which is still functioning, and updating the global status pointer in said nonvolatile memory.

4. The method recited in claim 2 wherein if the step of selecting cannot be performed by selecting a first of said two data storage devices in a string attached to a first one of said pair of data storage device controllers and a second of said data storage devices in a string attached to a second one of said pair of data storage device controllers, then performing the step of selecting by selecting the two data storage devices from separate units.

5. The method recited in claim 4 wherein if the step of selecting cannot be performed by either selecting a first of said two data storage devices in a string attached to a first one of said pair of data storage device controllers and a second of said data storage devices in a string attached to a second one of said pair of data storage device controllers or by selecting the two data storage devices from separate units, then selecting two data storage devices on different spindles of a unit.

6. A data processing system which retains information about a data storage subsystem of the data processing system across power downs comprising:

a host system containing a plurality of channels;

a controller attached to at least one of said channels of the host system, said controller including a pair of data storage device controllers and a memory containing vital product data and a joint array structure initialized by said vital product data on initial microprogram load, said vital product data being stored in nonvolatile memory; and a plurality of data storage devices attached to each of said data storage device controllers, each of said data storage devices being of the same type and comprising a plurality of records recorded on a plurality of data tracks and a status track;

said controller further including:

writing means for writing on said status track of each said data storage device identification and status information for the device;

selecting means for selecting two of said data storage devices, said means for writing additionally writing global subsystem status on said status track, said global subsystem status containing information pertaining to all components of the subsystem, including a device number and a subsystem identification number of each data storage device, and a global status pointer containing address information about the selected data storage devices;

means, responsive to initialization of the subsystem, for performing an initial microprogram load to establish an operational data path between attaching channels of said data storage device controllers and said data storage devices;

reading means for reading the global subsystem status from each of the two selected data storage devices and, when valid and current global subsystem status is identified, said writing means writing said valid and current global subsystem status to the status track of both said data storage devices to insure the status is consistent on both of devices;

as data storage devices become available, said reading means reading the device number and subsystem identification number of each data storage device;

means for checking said number against the global status to ensure that said data storage devices are correctly attached; and means for notifying the host of available storage paths to said plurality of data storage devices.

7. The data processing system recited in claim 6 wherein said selecting means selects a first of said two data storage devices in a string attached to a first one of said pair of data storage device controllers and a second of said data storage devices in a string attached to a second one of said pair of data storage device controllers.

8. The data processing system recited in claim 7 wherein, in response to a failure of one of said first or second data storage devices, said selecting means increments a reconfiguration count in said global status pointer to show that reconfiguration has taken place, selects a new data storage device to replace the failed device and writing the global subsystem status to the status track of the new device, writes the global subsystem status to the second or first data storage device which is still functioning, and updates the global status pointer in said nonvolatile memory.

9. The data processing system recited in claim 8 wherein if said selecting means cannot select a first of said two data storage devices in a string attached to a first one of said pair of data storage device controllers and a second of said data storage devices in a string attached to a second one of said pair of data storage device controllers, then said selecting means selects the two data storage devices from separate units.

10. The data processing system recited in claim 9 wherein if said selecting means cannot select either a first of said two data storage devices in a string attached to a first one of said pair of data storage device controllers and a second of said data storage devices in a string attached to a second one of said pair of data storage device controllers or by selecting the two data storage devices from separate units, then said selecting means selects two data storage devices on different spindles of a unit.

* * * * *